United States Patent [19]

Liang

[11] Patent Number: 4,797,448
[45] Date of Patent: Jan. 10, 1989

[54] ADDITIVE FOR ARYLENE SULFIDE POLYMERS OF IMPROVED IMPACT STRENGTH

[75] Inventor: Yeon F. Liang, Florence, S.C.

[73] Assignee: Phillips Petroleum Company, Bartlesville, Okla.

[21] Appl. No.: 57,406

[22] Filed: Jun. 2, 1987

Related U.S. Application Data

[60] Division of Ser. No. 875,815, Jun. 18, 1986, Pat. No. 4,708,983, and a continuation-in-part of Ser. No. 744,078, Jun. 12, 1985, abandoned.

[51] Int. Cl.$^4$ ................................................ C08F 8/00
[52] U.S. Cl. .................................... 525/106; 524/188; 524/262; 524/267; 524/268; 524/269; 525/105; 525/102; 264/331.15
[58] Field of Search ...................... 525/106, 105, 102; 524/188, 262, 267, 268, 269; 264/331.15

[56] References Cited

U.S. PATENT DOCUMENTS 4,138,387 2/1979 Bleustein ............................ 525/106
4,201,698 5/1980 Itoh et al. ............................ 525/106

Primary Examiner—Melvyn I. Marquis
Attorney, Agent, or Firm—K. K. Brandes

[57] ABSTRACT

A polymer composition is provided comprising at least one poly(arylene sulfide), at least one polysiloxane, at least one trialkoxysilane, and at least one solid, resinous polyolefin. Molded objects made of this polymer composition have greater impact strength than those made of poly(arylene sulfide), preferably poly(phenylene sulfide). In one embodiment, an additive composition comprising at least one polysiloxane, at least one trialkoxysilane and at least one solid, resinous polyolefin is provided. The additives can be blended with poly(arylene sulfide) so as to improve its impact strength. In another embodiment, a polymer composition is provided comprising at least one poly(arylene sulfide), at least one polysiloxane having molecular in the range of from about 100,000 to about 400,000, and optionally at least one trialkoxysilane.

18 Claims, No Drawings

ADDITIVE FOR ARYLENE SULFIDE POLYMERS OF IMPROVED IMPACT STRENGTH

This application is a division of application Ser. No. 875,815, filed June 18, 1986, now U.S. Pat. No. 4,708,983, which is a continuation-in-part application of application Ser. No. 744,078, filed June 12, 1985, now abandoned.

BACKGROUND OF THE INVENTION

This invention relates to compositions comprising arylene sulfide polymers. In one aspect, this invention relates to compositions comprising arylene sulfide polymers and additives, which enhance the impact strength of the polymers. In other aspects, this invention relates to methods of blending suitable additives with arylene sulfide polymers in sufficient quantity to improve impact strength of the arylene sulfide polymers.

Arylene sulfide polymers, of which poly(phenylene sulfide) is representative, have unique properties and are being used for an increasing number of applications where physical properties such as electrical insulation, thermal stability and chemical resistance are of importance. Polyarylene sulfide compounds are reported to be useful in a number of applications requiring good impact strength. For example, a number of pump manufacturers are using polyarylene sulfide compounds in sliding vanes, impeller cases, gage guards and seals. Other applications include aircraft and automotive parts, ball valves, pistons, compressor components, gears and gear housings, computer and electronic parts and components, conduits, etc. Due to difficulties in compounding and processing arylene sulfide polymers containing high proportions of fillers, various materials have been disclosed as additives to improve processability. For example, U.S. Pat. No. 4,134,874 discloses the addition of small amounts of ethylene polymers to arylene sulfide polymers to improve processability, but when added at more than about 5 weight percent of the total composition, the ethylene polymers are reported to reduce physical properties of the molding composition including impact strength and flexural modulus. U.S. Pat. No. 3,929,708 discloses the use of silicon fluids such as polysiloxanes of molecular weights of about 500 to 3,000 to improve the processing characteristics of arylene sulfide polymers. The mechanical properties such as tensile strength, elongation and Izod impact strength of the polymers are reportedly not adversely affected by the presence of such silicon fluids in amounts of about 0.05 to 5 weight percent. Several patents, e.g., U.S. Pat. No. 4,337,182, disclose the use of organic silanes in poly(phenylene sulfide) compositions.

SUMMARY OF THE INVENTION

An object of this invention is to provide arylene sulfide polymer compositions having improved impact strength. Another object of this invention is to provide a blend of ingredients to be added to arylene sulfide polymer compositions so as to improve the impact strength of these polymer compositions. A further object of this invention is to provide a process for improving the impact strength of arylene sulfide polymer.

Other objects, advantages and features of the invention will be readily apparent to one skilled in the art from the detailed description of the invention and the appended claims.

In accordance with the invention, it has been found that the addition of relatively small amounts of a polysiloxane and of a trialkoxysilane, in combination with a polyolefin, to arylene sulfide polymers results in polymer compositions having improved impact strength. Thus, in accordance with a first embodiment of this invention, polymer compositions are provided which comprise (a) at least one poly(arylene sulfide), (b) at least one polysiloxane, (c) at least one trialkoxysilane, and (d) at least one polyolefin.

In one embodiment of this invention, a composition is provided which has improved impact strength (after molding) and comprises 100 parts by weight of an arylene sulfide polymer, about 0.1 to about 25 parts by weight of a polysiloxane, about 0.01 to about 5 parts by weight of a trialkoxysilane and about 0.05 to 20 parts by weight of a polyolefin in the above defined arylene sulfide polymer composition. This composition exhibits improved impact strength at lower additive costs than a corresponding composition without a polyolefin.

In yet another embodiment of the invention, the impact strength (after molding) of arylene sulfide polymers is improved by a process comprising the step of blending effective amounts of at least one polysiloxane, at least one trialkoxysilane and at least one polyolefin with at least one arylene sulfide polymer. In a further embodiment, an additive blend (composition) is provided comprising at least one polysiloxane, at least one trialkoxysilane, and at least one polyolefin, said additive blend to be added to poly(arylene sulfide) compositions so as to improve the impact strength of said poly(arylene sulfide) compositions (after molding).

In a still further embodiment of this invention, a composition is provided which comprises 100 parts by weight of arylene sulfide polymer, preferably poly(phenylene sulfide), and about 6 to about 20 parts by weight of non-resinous, normally fluid (liquid) polysiloxane having molecular weight in the range of from about 100,000 to about 400,000. The term "normally" as used herein means: at about 20° C., 1 atm. Optionally, about 0.05-1 part by weight of trialkoxysilane is also present in this composition. A process for improving the impact strength of arylene sulfide polymer, preferably poly(phenylene sulfide), comprises the step of blending therewith at least one (i.e., one or two or more) polysiloxane as defined above, and optionally also a trialkoxysilane, at relative amounts listed above.

DETAILED DESCRIPTION OF THE INVENTION

Arylene Sulfide Polymers

The arylene sulfide polymers or poly(arylene sulfide) resins, often abbreviated PAS, to which this invention is applicable include those described in U.S. Pat. Nos. 3,354,129 issued to Edmonds and Hill on Nov. 21, 1967. The presently preferred polymer is poly(phenylene sulfide), often abbreviated PPS. The term poly(arylene sulfide) or PAS includes homopolymers and the normally solid arylene sulfide copolymers incorporating one or more comonomers, having melting or softening points of at least about 300° F. (149° C.) and more preferably from about 400 to about 900° F. (204°–482° C.). Other examples of poly(arylene sulfides) are poly(4,4'-biphenylene sulfide), poly(2,4-tolylene sulfide), copolymers made from p-dichlorobenzene and a comonomer such as o-dichlorobenzene, m-dichlorobenzene, 2,4-dichlorotoluene, 2,5-dichlorotoluene, 1,2,4-trichlorobenzene and the like. The abbreviations PAS and PPS are used generically to refer to these types of polymers in the discussion herein.

In one embodiment, the invention is directed to improving the properties of PAS admixed with fillers, e.g., clay, talc, iron oxide, carbon black, carbon fibers, ground glass, glass fibers, and the like, and mixtures thereof. The amount of such fillers can constitute up to about 75 weight percent of the total composition. In addition to such fillers, conventional additives such as pigments, lubricants, antistatic agents, etc. can be incorporated into the PAS-containing compositions, with the amounts of such ingredients used depending on the particular applications, performance and economics involved.

Polysiloxanes

The polysiloxanes used with this invention are those materials having the repeating units

wherein each R is a monovalent hydrocarbyl radical having from 1 to 8 carbon atoms, individually selected from the group consisting of alkyl, cycloalkyl, alkylcycloalkyl, aryl and alkaryl. The radicals R can be the same or different. The molecular weights of these polysiloxanes can be within the range of from about 500 to about 500,000, preferably from about 100,000 to about 400,000, and more preferably from about 250,000 to about 400,000. It is presently preferred that the polysiloxanes be silanol-terminated. Such silanol-terminated polysiloxanes are represented by the formula

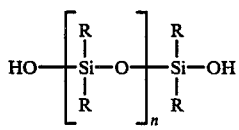

wherein each R is a monovalent hydrocarbyl radical as defined above; and n represents the degree of polymerization. In a preferred embodiment, a silanol-terminated polydimethylsiloxane having a molecular weight in the range of from about 250,000 to about 400,000 is employed.

Suitable polysiloxanes include, for example, but are not limited to, polyhydrocarbylsiloxanes such as
  polydimethylsiloxane
  polydiethylsiloxane
  polydihexylsiloxane
  polydicyclohexylsiloxane
  polydiphenylsiloxane
  polymethylphenylsiloxane
  polymethylethylsiloxane
  polycyclopentylpropylsiloxane
and the like, and mixtures thereof. Polyalkylsiloxanes which are liquid at ambient temperatures are presently preferred because they blend easily with the PAS polymer. Presently more preferred is polydimethylsiloxane, most preferably silanol-terminated polydimethylsiloxane.

Trialkoxysilanes

The trialkoxysilanes useful in this invention are those materials represented by the formula $$X-Si(OR^1)_3$$

where each $R^1$, which can be the same or different, is individually selected from the group consisting of alkyl, alkoxyalkyl or alkylcarbonyl radicals having from 1 to 8 carbon atoms; and X is a radical having from 1 to 8 carbon atoms selected from the group consisting of alkyl, alkenyl, epoxyalkyl, mercaptoalkyl, aminoalkyl, N-(aminoalkyl)aminoalkyl, ureideolkyl, haloalkyl, alkenoyloxyalkyl, and epoxyalkoxyalkyl groups. Such materials include, for example, but are not limited to
  vinyl triethoxysilane
  vinyl tri(2-methoxyethoxy)silane
  3-methacryloxypropyltrimethoxysilane
  beta-(3,4-epoxycyclohexyl)ethyltrimethoxysilane
  3-glycidoxypropyltrimethoxysilane
  3-mercaptopropyltrimethoxysilane
  3-aminopropyltriethoxysilane
  N-beta-(aminoethyl)gamma-aminopropyltrimethoxysilane
  3 - ureidopropyltriethoxysilane
  ethyltrimethoxysilane
  ethyltriacetoxysilane
  3-chloropropyltrimethoxysilane
  6 -mercaptohexyltributoxysilane
  dodecyltrihexoxysilane
and the like, and mixtures thereof.

Many of these materials are available commercially; for example, Union Carbide A-189 is 3-mercaptopropyltrimethoxysilane, and Union Carbide A-1100 is 3-aminopropyltriethoxysilane. Other commercially available trialkoxysilanes are disclosed in U.S. Pat. No. 4,176,098.

Polyolefins

The normally solid, resinous polymers of aliphatic mono-1-olefins, having preferably from 2 to 6 carbon atoms per monomer molecule such as polyethylene, polypropylene, ethylene/1-hexene copolymer, propylene/ethylene copolymer, and mixtures thereof, are blended with polysiloxane/trialkoxysilane/PAS compositions to improve properties of the compositions and to reduce the cost of the additive package and composition, since these polyolefins are less expensive than the polysiloxanes, trialkoxysilanes or PAS. Presently more preferred are polyethylene and polypropylene (most preferably in powder form). These terms including copolymers with minor amounts (up to about 15 mole-%) of other olefins, particularly ethylene/1-hexene and propylene/ethylene copolymers.

Proportions

In one embodiment, the approximate proportional weight ranges for the ingredients disclosed above in the compositions of this invention are shown as follows in Table I.

TABLE I

| | Parts by Weight | | |
|---|---|---|---|
| Ingredients | Broadly | Preferred | Most Preferred |
| PAS | 100 | 100 | 100 |
| Polysiloxane | 0.1 to 25 | 0.5 to 15 | 0.7 to 10 |
| Trialkoxysilane | 0.01 to 5 | 0.05 to 1 | 0.07 to 0.5 |

TABLE I-continued

| Ingredients | Parts by Weight | | |
|---|---|---|---|
| | Broadly | Preferred | Most Preferred |
| Polyolefin | 0.05 to 20 | 0.1 to 10 | 0.5 to 6 |

In another embodiment, an additive composition, preferably used for improving the physical properties of molded polymer compositions containing at least one poly(arylene sulfide), comprises at least one polysiloxane, at least one trialkoxysilane and at least one polyolefin of the types disclosed above. It is within the scope of this invention to also add at least one poly(arylene sulfide) as an optional ingredient to this composition, e.g., up to 20 parts by weight of PAS. Broadly, the additive composition comprises from about 0.1 to about 25 (preferably about 0.5-15) parts by weight of polysiloxane, from about 0.01 to about 5 (preferably about 0.05-2) parts by weight of trialkoxysilane, from about 0.05 to about 25 (preferably about 0.5-20) parts by weight of polyolefin, and optionally up to about 20 (preferably about 1-20) parts by weight of poly(arylene sulfide). The preferred additive composition is in the form of plastic elements such as solid pellets which contain the polysiloxane, the trialkoxysilane and the polyolefin. These plastic particles are made by melting the polyolefin, optionally in combination with the poly(arylene sulfide), blending the melt and the polysiloxane and trialkoxysilane, extruding the blend as strands and cutting the cooled strands. These particles, or masterbatch, can be readily blended into the final product.

The use of such an additive composition thus permits the convenient blending of the desired proportions of additive into poly(arylene sulfide) compositions to improve their impact strength. The use of poly(arylene sulfide) in the additive composition is advantageous because of improved handling characteristics during the final blending. In addition to the above ingredients, fillers, pigments, lubricants, antistatic agents, etc. can be incorporated into the composition. Methods of mixing or blending the compositions useful in the present invention include the conventional processes known in the art. Particularly useful is dry blending of the various blend components in a commercial apparatus, followed by melting, extruding and pelleting using a commercial apparatus. In one embodiment of the invention, quantities of a polysiloxane, a trialkoxysilane, and a polyolefin are blended with the PAS in amounts effective to produce the desired improvement in the physical properties of the final molded composition, e.g. the impact strength as measured by Izod impact tests with notched or unnotched molded samples.

In a further embodiment, a high impact composition comprises 100 parts by weight of poly(arylene sulfide), preferably poly(phenylene sulfide), and about 6-20 parts by weight of normally fluid, non-resinous polysiloxane having molecular weight in the range of from about 100,000 to about 400,000. Preferably, the amount of polysiloxane (either one or two or more) is about 8 to about 15 (more preferably about 10 to about 12) parts by weight per 100 parts by weight of poly(arylene sulfide), preferably PPS. Preferably, the polysiloxane has a molecular weight in the range of from about 250,000 to about 400,000 and is silanol-terminated, as defined above. Optionally, at least one trialkoxysilane as defined above is also present in the high impact composition, preferably at a relative amount in the range of from about 0.05 to about 1, more preferably from about 0.07 to about 0.5, parts by weight per 100 parts by weight of poly(arylene sulfide).

In a still further embodiment, a process for improving the impact strength of poly(arylene sulfide) comprises the step of blending 100 parts by weight of poly(arylene sulfide), preferably PPS, with about 6-20 (preferably about 8-15, more preferably about 10-12) parts by weight of polysiloxane as defined above in the preceding paragraph and, optionally, also about 0.05-1 (preferably about 0.07-0.5) parts by weight of trialkoxysilane as defined above. The blend can then be melted, extruded, pelleted and used in molding applications.

The improved impact strength of the poly(arylene sulfide) containing compositions is exhibited after these compositions are molded. Suitable molding processes are well known operations such as injection molding, compression molding, hot stamping, ram-type extrusion and the like. Typically compression molded parts of these compositions are commercially formed at about 600°-700° F., 1000 psi or greater, for about 5 minutes at equilibrium. Commercial-scale injection molding of said compositions can be carried out in a reciprocating molding machine with a mechanical or high torque hydraulic screw drive, typically at a barrel temperature of about 650° F., a mold temperature of about 250°-280° F., an injection pressure of about 15,000 psi, a hold pressure of about 8,000 psi, and a cycle time of about 90 seconds. However, other molding conditions may be applied if they are more suitable for specific filled PAS compositions.

The invention will be illustrated further by the following non-limiting examples.

Example I

This example demonstrates the effectiveness of both a siloxane and a silane on the impact resistance of a poly(p-phenylene sulfide), referred hereinafter as PPS. The general procedure for preparing and evaluating test specimens was as follows: 898.2 grams of PPS having a melt flow 20-65 grams per 10 minutes (measured in accordance with test method ASTM D 1238 at 600° F. (316° C.) using a 5 kilogram weight), 99.8 grams of a polysiloxane (a silanol-terminated polydimethylsiloxane, molecular weight: 310,000, viscosity: $10^6$ centistokes at 25° C., from the Petrarch Systems, Inc., Bristol, PA), and 2 grams of 3-aminopropyltriethoxysilane (A-1100, Union Carbide Corporation, Danbury, CT) were mixed in a tumble mixer for about 5 minutes at ambient room temperature. The mixture was extruded through a Davis Standard extruder at 600° F. (316° C.), ground into a granular or coarse powder, dried in a 350° F. (177° C.) oven for 3 hours and molded into test specimens, 5 inches X 1 inch X 0.125 inch using a New Britain molding machine (barrel temperature: about 600° F., mold temperature: about 275° F.).

Izod impact properties were then determined according to test method ASTM D256 on notched and unnotched specimens. Generally, four tests were made and the results were averaged. The procedure was repeated several times, once where the A-1100 silane was replaced with 3-mercaptopropyltrimethoxysilane (A-189, Union Carbide Corporation), once where only the polysiloxane was used but no trialkoxysilane, and finally a control where only the PPS was used with no polysiloxane or trialkoxysilane.

The results listed in Table II show that Izod impact resistance of PPS was increased by adding about 10 weight percent of a silanol-terminated polydimethylsiloxane (see Run 2 vs. Run 1) and, optionally, also 0.2 weight percent of 3-aminopropyltriethoxysilane (A-1100) or 3-mercaptopropyltrimethoxysilane (A-189) (see Runs 4 and 3 vs. Run 1). Unnotched Izod impact strength of the molded compositions containing PPS, polysiloxane and trialkoxysilane (Runs 3 and 4) was higher than that of the composition containing PPS and a polysiloxane (Run 2).

TABLE II

Effect of Siloxane-Silane Blends on PPS Impact Resistance

| | Wt. % Blend Composition | | | Izod Impact Resistance, J/M$^c$ | |
|---|---|---|---|---|---|
| Run | PPS$^a$ | Poly-siloxane$^b$ | Trialkoxy-silane | Notched | Unnotched |
| 1 | 100 | — | — | 34 | 157 |
| 2 | 90 | 10 | — | 48 | 294 |
| 3 | 89.82 | 9.98 | 0.20$^d$ | 42 | 356 |
| 4 | 89.82 | 9.98 | 0.20$^e$ | 43 | 476 |

$^a$Uncured PPS, MR03, from Phillips Chemical Company, Bartlesville, OK.
$^b$Silanol-terminated polydimethylsiloxane, MW 310,000 from Petrarch Systems, Inc., Bristol, PA.
$^c$Values are average of 4 determinations. J/M = Joules per meter.
$^d$A-189, 3-mercaptopropyltrimethoxysilane from Union Carbide, Danbury, CT.
$^e$A-1100, 3-aminopropyltriethoxysilane, from Union Carbide.

EXAMPLE II

This invention example demonstrates the effectiveness of also adding a polyolefin to a blend of PPS, a polysiloxane and a trialkoxysilane. The procedure described in Example I was essentially repeated, except that in addition to the polysiloxane and trialkoxysilane either polyethylene or propylene-ethylene copolymer was also added to the PPS composition. Test results are listed in Table III, where it is shown that improved Izod impact resistance (both notched and unnotched) of PPS that obtained by blending either polyethylene or propylene-ethylene copolymer into a composition comprising PPS, a polysiloxane and a trialkoxysilane (Runs 8 and 11). Furthermore, a comparison of data in Tables II and III show that the addition of the polyolefin permits to use less of the more expensive polysiloxane and silane additives while still attaining good impact resistance, especially notched impact. Notched impact data of invention Runs 8 and 11 were higher than those of Runs 3 and 4 using considerably more polysiloxane and trialkoxysilane.

TABLE III

Effect of Polyolefins on the Izod Impact Resistance of Composition Comprising PPS/Siloxane/Silane

| | Wt. Percent Blend Composition | | | | | Izod Impact, J/M$^f$ | |
|---|---|---|---|---|---|---|---|
| Run | PPS$^a$ | PE$^b$ | PP$^c$ | Polysi-loxane$^d$ | Tri-alkoxy-silane$^e$ | Notched | Un-notched |
| 5 | 100 | — | — | — | — | 35 | 132 |
| 6 | 95 | 5 | — | — | — | 37 | 111 |
| 7 | 94.06 | 4.95 | — | 0.99 | — | 43 | 148 |
| 8 | 93.97 | 4.95 | — | 0.99 | 0.09 | 52 | 174 |
| 9 | 95 | — | 5 | — | — | 44 | 173 |
| 10 | 94.06 | — | 4.95 | 0.99 | — | 48 | 188 |
| 11 | 93.97 | — | 4.95 | 0.99 | 0.09 | 52 | 207 |

$^a$Uncured PPS, MR03 from Phillips Petroleum Company
$^b$Polyethylene, Marlex HXM 50100 from Phillips Petroleum Company, density: about 0.955 g/cc, containing about 1 weight % 1-hexene comonomer
$^c$Polypropylene, Hercules PKO Type 7823; a propylene-ethylene copolymer with about 10 weight % ethylene comonomer
$^d$Silanol-terminated polydimethylsiloxane, MW 310,000 from Petrach Systems, Inc.
$^e$A-1100, 3-aminopropyltriethoxysilane from Union Carbide
$^f$Values are average of 4 determinations, J/M = Joules per Meter.

EXAMPLE III

This example illustrates process for blending PPS with a low molecular weight polysiloxane as described in U.S. Pat. No. 3,929,708 and with a high molecular weight polysiloxane as described in Example I, respectively, both added in a relatively high amount.

In an invention run, 1080 grams of FSA-1 PPS (melt flow under conditions described in Example I: about 20–70 grams per 10 minutes) and 120 grams of silanol-terminated polydimethylsiloxane having a molecular weight of 310,000 and a viscosity of 1,000,000 centistokes at 25° C. (being a syrupy liquid at room temperature; marketed under the product designation of PS 349.5 by Petrarch Systems) were tumble-blended in a Henschel mixer for about 5–10 minutes at room temperature. The blend was extruded through a 5-hole die at about 80 r.p.m. and 600° F. in a 1½inch diameter, 24/1 length/diameter Davis-Standard extruder. The extruded strands were chopped into pellets, which were dried for 2 hours at 300° F. and then molded into test specimens of 0.125 inch thickness by a New Britain molding machine (barrel temperature: about 600° F.; mold temperature: about 100° F.). The molding process was carried out without any operational problems.

The procedure as described above was repeated for a blend of 1080 grams of FSA-1 PPS and 120 grams of silanol-terminated polydimethylsiloxane having a molecular weight of 1700 and a viscosity of 15–35 centistokes at 25° C. (oily liquid at room temperature; marketed under the product designation of PS 340 by Petrarch Systems). It was impossible to make molded specimens of this blend because of excessive lubricating action and because of apparent incompatibility of the low molecular weight polysiloxane with PPS at the high level of about 11 parts by weight per 100 parts by weight of PPS. The injection mold screw did not pick up the PPS/polysiloxane blend and thus could not fill the injection barrel. Liquid polysiloxane (not in admixture with PPS) dripped from the extruder die. No molded test specimens using this blend of PPS and PS 340 low molecular weight polysiloxane could be obtained.

The test results of this example clearly show that blends containing PPS and large amounts (such as in excess of about 6 parts by weight per 100 parts by weight of PPS) of highly fluid, low molecular weight polysiloxane (such as those having a viscosity at 25° C. of about 6,000 centistokes or less, as described in U.S. Pat. Nos. 3,927,708 and 4,259,756) are unsuited for making molded PPS/polysiloxane objects having high impact. In other words, when added in large amounts (such as in excess of about 6 parts by weight per 100 parts by weight of PPS), these low viscosity, low molecular polysiloxanes are not at all suited for improving the impact strength of polymer compositions comprising Poly(arylene) sulfide, inparticular PPS.

Reasonable variations and modifications, which will be apparent to those skilled in the art, can be made in this invention without departing from the spirit and scope thereof.

I claim:

1. A composition comprising
   (A) at least one polysiloxane having the repeating unit

(B) at least one trialkoxysilane having the formula X—Si(OR')$_3$, and
   (C) at least one solid, resinous polyolefin selected from the group consisting of homopolymers and copolymers of mono-1-olefins having from 2 to 6 carbon atoms per molecule;
   wherein each R is a monovalent hydrocarbyl radical having from 1 to 8 carbon atoms, individually selected from the group consisting of alkyl, cycloalkyl, alkylcycloalkyl, aryl and alkaryl; each R' is a radical having from 1 to 8 carbon atoms, individually selected from the group consisting of alkyl and alkoxyalkyl radicals; and X is a radical having from 1 to 8 carbon atoms, selected from the group consiting of mercaptoalkyl and aminoalkyl groups.

2. A compsition in accordance with claim 1 wherein said solid, resinous polyolefin is selected from the group consisting of polyethylene and polypropylene.

3. A composition in accordance with claim 1 wherein the molecular weight of said polysiloxane is in the range of from about 100,000 to about 400,000.

4. A composition in accordance with claim 3 wherein said polysiloxane is a silanol-terminated polysiloxane.

5. A composition in accordance with claim 1 wherein said polysiloxane is a silanol-terminated polydimethylsiloxane having a molecular weight in the range of from about 250,000 to about 400,000.

6. A composition in accordance with claim 1 wherein said trialkoxysilane is selected from the group consisting of 3-mercaptopropyltrimethoxysilane and 3-aminopropyltriethoxysilane.

7. A composition in accordance with claim 1 comprising from about 0.1 to about 25 parts by weight of said polysiloxane, from about 0.01 to about 5 parts by weight of said trialkoxysilane, and from about 0.05 to about 25 parts by weight of said solid, resinous polyolefin.

8. A composition in accordance with claim 7 wherein the molecular weight of said polysiloxane is in the range of from about 100,000 to about 400,000, and said solid, resinous polyolefin is selected from the group consisting of polyethylene and polypropylene.

9. A composition in accordance with claim 1 comprising about 0.5 to about 15 parts by weight of said polysiloxane, about 0.05 to about 2 parts by weight of trialkoxysilane, and about 0.5 to about 20 parts by weight of said polyolefin.

10. A composition in accordance with claim 9 wherein the molecular weight of said polysiloxane is in the range of from about 100,000 to about 400,000, and said polyolefin is selected from the group consisting of polyethylene and polypropylene.

11. A oomposition in accordance with claim 1, wherein said composition is a solid.

12. A composition in accordance with claim 11, wherein said composition is in the form of solid plastic particles.

13. A composition in accordance with claim 12, wherein said plastic particles are pellets.

14. A composition in accordance with claim 1 consisting essentially of components (A), (B) and (C).

15. A composition in accordance with claim 1, wherein said composition, when blended with a poly(arylene sulfide) composition, improves the impact strength of said poly(arylene sulfide) composition after molding.

16. A composition in accordance with claim 15, wherein said poly(arylene sulfide) composition is a poly(phenylene sulfide) composition.

17. A composition in accordance with claim 1, wherein said composition has been prepared by a process comprising blending of component (A), component (B) and a melt of component (C).

18. A composition in accordance with claim 17, wherein said process further comprises the steps of extruding a liquid blend of component (A), (B) and (C) as strands, cooling said strands, and cutting the cooled strands.

* * * * *